United States Patent [19]

Cogan

[11] Patent Number: 4,468,682

[45] Date of Patent: Aug. 28, 1984

[54] SELF-ALIGNED HIGH-FREQUENCY STATIC INDUCTION TRANSISTOR

[75] Inventor: Adrian I. Cogan, Waltham, Mass.

[73] Assignee: GTE Laboratories Incorporated, Waltham, Mass.

[21] Appl. No.: 320,240

[22] Filed: Nov. 12, 1981

[51] Int. Cl.³ .................... H01L 29/80; H01L 29/06; H01L 29/04
[52] U.S. Cl. ........................................ 357/22; 357/56; 357/59; 357/55
[58] Field of Search ...................... 357/22, 59, 56, 15, 357/55

[56] References Cited

U.S. PATENT DOCUMENTS

| 3,886,580 | 5/1975 | Calviello | 357/15 |
| 3,905,036 | 9/1975 | Goronkin | 357/22 |
| 4,146,902 | 3/1979 | Tanimoto et al. | 357/59 |
| 4,196,440 | 4/1980 | Anantha et al. | 357/55 |

FOREIGN PATENT DOCUMENTS 55-91879  7/1980  Japan .................... 357/22

OTHER PUBLICATIONS

"Mitsubishi JFET Device Operates at Ultrahigh Frequency" Electronics, vol. 49, #15, Jul. 22, 1976, pp. 3E-4E.

Primary Examiner—Andrew J. James
Assistant Examiner—John LaMont
Attorney, Agent, or Firm—J. Stephen Yeo; Robert E. Walrath

[57] ABSTRACT

A gate-source structure and fabrication method for a surface-gate static induction transistor. The method requires only one masking step during fabrication, thereby eliminating or minimizing mask registration problems during fabrication of the devices. The method and the device are characterized by a two-step etching process which forms T-shaped gate windows in layers of polycrystalline silicon with different doping levels. The source region is formed during an annealing step from the layer with high doping level. During the annealing step, the gate regions are also formed from gate impurities implanted previously in the gate windows. The source structure and the gate structure are separated by a silicon dioxide protective layer.

1 Claim, 6 Drawing Figures

SELF-ALIGNED HIGH-FREQUENCY STATIC INDUCTION TRANSISTOR

BACKGROUND OF THE INVENTION

This invention relates to gate-source structures for static induction transistors and, in particular, to a surface gate structure which improves device performance and which requires relatively simple fabrication techniques.

The static induction transistor is a field effect semiconductor device capable of operation at relatively high frequency and power. The transistors are characterized by a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel below the source. As the magnitude of the reverse bias is varied, the source-drain current and voltage derived from an attached energy source will also vary.

The design and fabrication of the gate-source structure is difficult. In order to operate at frequencies near or above 1 GHz, such devices must be built under extremely precise dimensional control. Involved dimensions are in the micrometer range, requiring photolithographic alignments with submicrometer precision.

The requirement for precise dimensional control makes the processing of high-frequency semiconductor devices costly and difficult. It is desirable to eliminate fabrication steps requiring precise mask registration and to, where possible, use procedures in which elements of the transistor are self-aligned.

SUMMARY OF THE INVENTION

The present invention discloses a structure for a high frequency static induction transistor having a surface gate geometry which is relatively simple to fabricate. The invention also discloses a procedure by which the transistor is manufactured using standard processing steps with relaxed mask registration requirements to form the self-aligned gate-source structure. The resulting device is capable of obtaining a cutoff frequency in the 10 GHz region without sacrificing the high voltage capability inherent in static induction transistor structures.

The static induction transistor of the present invention utilizes the differential etching rate in highly doped and in lightly doped polycrystalline silicon. A highly doped layer of polycrystalline silicon is deposited on a high resistivity epitaxial semiconductor layer. A lightly doped layer of polycrystalline silicon is then deposited on the highly doped layer. An anisotropic plasma etching step is used to etch masked windows through the lightly doped layer and part of the highly doped layer. A wet etching step is then used in which the etching mix is chosen to have a higher etching rate in the highly doped layer than in the lightly doped layer, resulting in a window through both layers which is wider at the bottom than at the top. After removal of the photoresist mask a silicon dioxide layer is deposited on all exposed surfaces, then removed from the unprotected horizontal surfaces. Gate region impurities are implanted and the wafer is annealed to form both gate and source regions, the source region being activated by the highly doped layer. Silicon dioxide formed during the annealing step is removed and metal electrodes are deposited.

Since only one mask is used, no alignment is required before reaching this point of the procedure. However, a second low resolution mask may be required to form the metal around the gate and source contact periphery to allow separation of devices formed on the same wafer.

The elements of the Figures are not drawn to scale and the Figures are intended only for use in explanation of the fabricating steps and the resulting structure.

DETAILED DESCRIPTION OF THE INVENTION

A wafer, or substrate, of single crystal semiconductor material of one conductivity type is provided as the supporting structure for fabrication of a field effect semiconductor device or static induction transistor according to the present invention. The substrate may be, by way of example, silicon of n-type conductivity.

Figure 1:
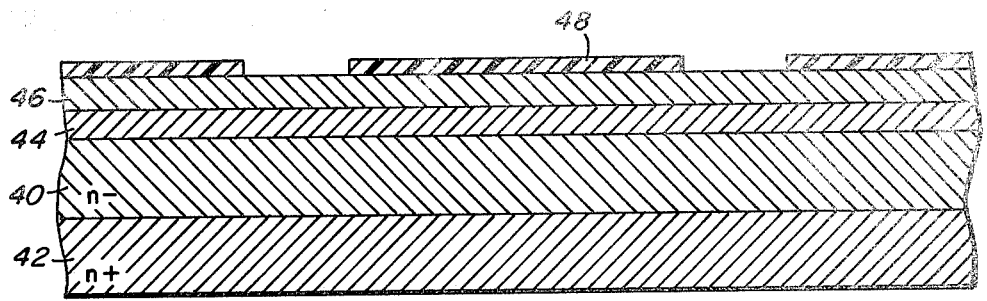
FIG. 1 is a cross-sectional view of a semiconductor macro-crystal wafer indicating highly doped and lightly doped layers as well as gate window masking.

FIG. 1 illustrates a fragment of semiconductor wafer during processing of a static induction transistor according to a preferred embodiment of the present invention. A thin, high resistivity epitaxial layer 40 of n-type conductivity is grown on the upper surface of highly doped substrate 42 of the same conductivity type. The epitaxial layer 40 may be, for example, 10 microns thick and about 20 to 40 ohm-cm resistivity. A layer 44 of highly doped polycrystalline silicon is deposited on the epitaxial layer 40. Highly doped layer 44 is also of the same conductivity type and may be, for example, 400 or 500 nanometers thick. A layer 46 of lightly doped polycrystalline silicon is then deposited on highly doped layer 44. Lightly doped layer 46 is also of the same conductivity type and may also be, for example, 400 or 500 nanometers thick. Photoresist mask 48 is then applied. Mask 48 has openings of about 2 microns in width where gate junctions are to be formed. There is no alignment required for mask 48.

Figure 2:
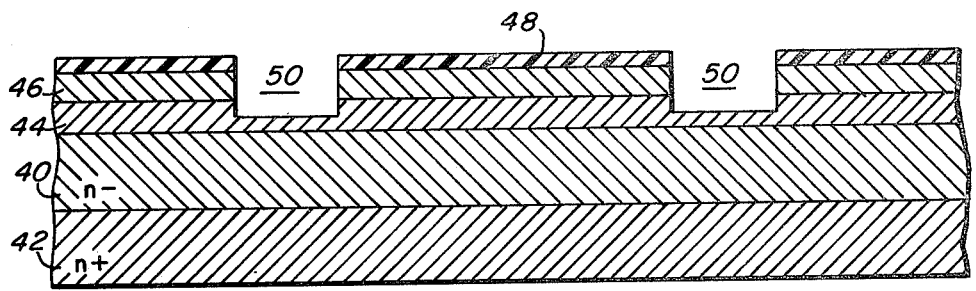
FIG. 2 illustrates the use of an anisotropic plasma etching step on the same wafer.

As illustrated in FIG. 2, partial gate windows 50 are then etched through lightly doped layer 46 and partially through highly doped layer 44. An anisotropic plasma etch procedure is used to maintain the same horizontal dimension for both layers.

Figure 3:
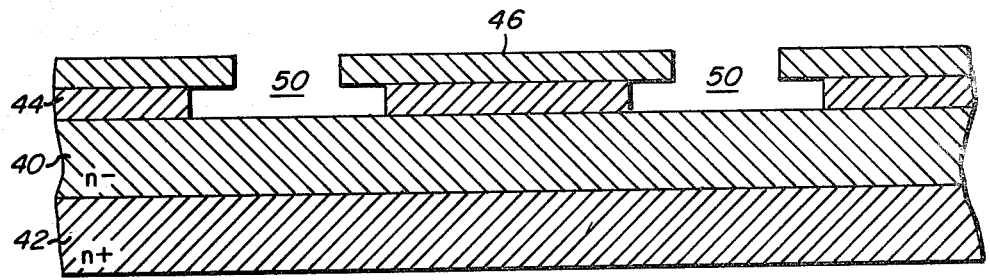
FIG. 3 illustrates the subsequent use of a wet etching step on the same wafer.

Subsequently, a wet etching step is performed in which the etching mix is chosen to have a higher etching rate in highly doped layer 44 than in lightly doped layer 46. An example of such an etching mix is a combination of hydrofluoric acid, nitric acid and acetic acid. Due to the higher etching rate in highly doped layer 44, T-shaped gate region windows 50 will be formed as indicated in FIG. 3. The gate windows are wider at the bottom, approximately 5 to 6 microns maximum, than at the top and extend through layers 46 and 44 to the surface of epitaxial layer 40. Photoresist mask 48 is then removed exposing T-shaped structures of n-type polycrystalline silicon on the epitaxial layer 40 with a wider portion 46 on top and a narrower portion 44 on the bottom adjacent to epitaxial layer 40.

Figure 4:
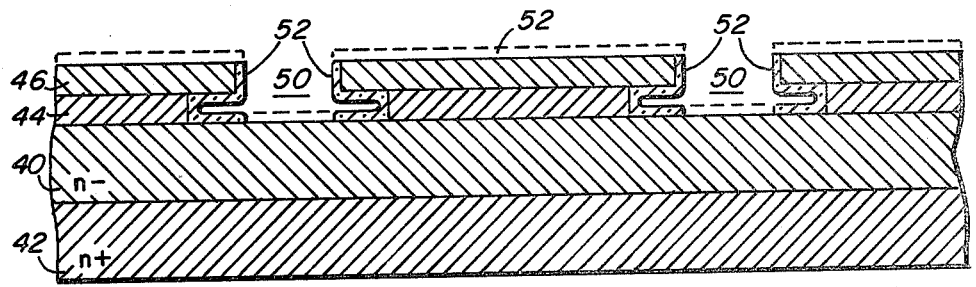
FIG. 4 illustrates deposition and partial removal of a silicon dioxide layer on the wafer.

As indicated in FIG. 4, a silicon dioxide layer 52 is then thermally grown on all exposed surfaces of the etched wafer. As also illustrated in FIG. 4, reactive ion etching is then used to remove silicon dioxide layer 52 in the unmasked horizontal regions. Due to the strong anisotropy in the reactive ion etching process, the vertical parts of silicon dioxide layer 52 as well as the protected or masked horizontal parts at the base of gate windows 50 are not removed. The edges and lower surfaces of lightly doped layer 46 and the edge of highly doped layer 44 remain covered by silicon dioxide layer 52.

Figure 5:
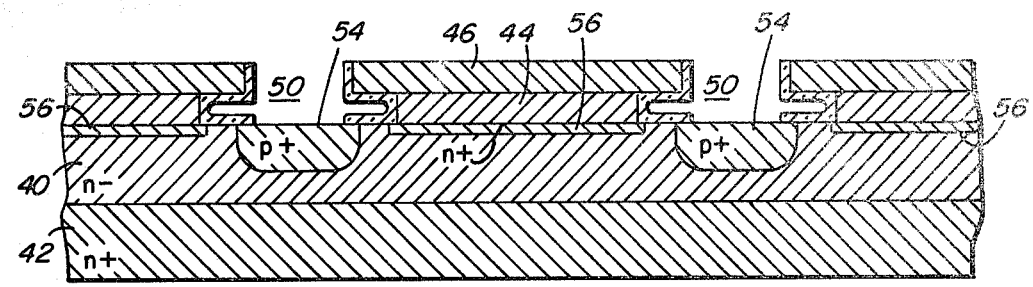
FIG. 5 illustrates formation of gate and source regions in the epitaxial layer of the wafer.

FIG. 5 illustrates formation of gate regions 54 and source regions 56 in epitaxial layer 40. Gate region 54 may be formed by a high energy p-type implantation step followed by a short annealing step for activation of the implanted n-type impurities. During the annealing step, impurities from the highly doped polycrystalline layer 44 will form highly doped n-type source regions 56. The p-type and n-type impurities are chosen to have largely differing diffusion constants such that the p-type impurity diffuses faster than the n-type, forming a gate region 54 which is much deeper than source region 56. For example, boron diffuses almost ten times faster than arsenic at 1100 degrees Celsius. The annealing and diffusion steps will form a gate junction approximately 1.5 to 2 microns deep and a source region about 0.2 micron deep, allowing increased breakdown voltage for the static induction transistor. Parenthetically, it is noted that gate regions 54 and source regions 56 have been formed with a separation distance determined by the formation of the T-shaped window 50 during the wet etching process on lightly doped layer 46 and heavily doped layer 44.

Figure 6:
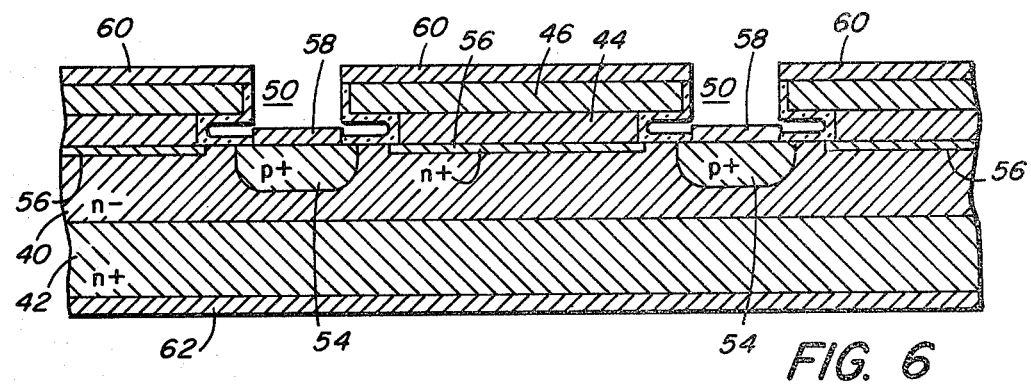
FIG. 6 illustrates metal deposition to form source and gate electrodes.

After a short wet etch in, for example, buffered hydrofluoric acid to remove any thin silicon dioxide surface grown during the annealing and diffusion step, contact metal is deposited over the entire wafer to form gate electrodes 58 and source electrodes 60 as indicated in FIG. 6. Due to the step between the gate electrode 58 and source electrode 60, the metal will deposit on the elevated regions 46 and on the bottom of windows 50 and not on the vertical walls. Hence, no masking is required. A single or multiple metal depositing procedure can be used.

The method described has required use of one masking step for which no alignment was necessary. That masking step was for the purpose of positioning gate windows 50. A second low resolution masking step may be used to pattern metal around the gate and source electrode periphery in order to separate devices formed on the same wafer.

Metal is also deposited on the opposite surface of the wafer to form a drain electrode 62. After processing the individual devices can be separated by any one of a number of conventional techniques.

In the various figures a cross-section of a vertical geometry static induction transistor is shown. Gate regions 54 are formed as strips, for example, 100 to 120 microns in length normal to the plane of the cross-section. Similarly, source region 56 is formed as a strip, for example, about 10 microns shorter than the gate regions 54. The length of the regions is primarily limited by the maximum permitted voltage drop along the electrodes which contact the regions. Additionally, a device with a single source and two gates is shown in FIG. 6. For increased power handling capability additional cells or gate-source combinations can be added as in the normal practice without departing from the scope of the invention.

As described, the processing sequence makes possible the manufacture of static induction transistors with selfaligned gate and source electrodes and with no precise registration and alignment requirements. Micron size gate and source regions can be defined using standard semiconductor technology processing and without using sophisticated and expensive alignment equipment.

What is claimed is:

1. A vertical geometry static induction transistor comprised of:

a substrate of highly doped n-type single crystal silicon;

a metal drain electrode on one side of said substrate;

an epitaxial layer of high resistivity n-type silicon on the opposite side of said substrate;

a plurality of T-shaped structures of n-type polycrystalline silicon on said epitaxial layer, said T-shaped structures having wider portion on the top and a narrower portion on the bottom adjacent to said epitaxial layer;

a plurality of T-shaped windows defined by adjacent T-shaped structures; said T-shaped windows wider on the bottom than at the top;

a layer of silicon dioxide on the sides of said T-shaped windows;

a gate region of p-type silicon in said epitaxial layer at the bottom of each of said T-shaped windows;

a source region of highly doped n-type silicon in said epitaxial layer beneath each of said T-shaped structures;

a metal gate electrode on top of each of said gate regions; and a metal source electrode on top of each of said T-shaped structures.

* * * * *